United States Patent
Nakamura

(10) Patent No.: US 8,994,729 B2
(45) Date of Patent: Mar. 31, 2015

(54) METHOD FOR SIMULATING OPERATION OF OBJECT AND APPARATUS FOR THE SAME

(75) Inventor: Naohito Nakamura, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 662 days.

(21) Appl. No.: 12/819,798

(22) Filed: Jun. 21, 2010

(65) Prior Publication Data

US 2010/0321383 A1 Dec. 23, 2010

(30) Foreign Application Priority Data

Jun. 23, 2009 (JP) ................................. 2009-149056

(51) Int. Cl.
*G06T 15/10* (2011.01)
*G06F 3/048* (2013.01)
*G06F 17/00* (2006.01)
*G06F 19/00* (2011.01)
*G06T 19/00* (2011.01)
*G06F 3/01* (2006.01)
*G06F 17/50* (2006.01)

(52) U.S. Cl.
CPC ............. *G06T 19/006* (2013.01); *G06F 3/011* (2013.01); *G06F 3/017* (2013.01); *G06F 17/5009* (2013.01)
USPC ........... 345/427; 715/848; 715/850; 715/851; 463/31; 463/32; 463/33; 463/34

(58) Field of Classification Search
USPC ........ 345/427; 715/848, 850, 851; 463/31–34
See application file for complete search history.

(56) References Cited

U.S. PATENT DOCUMENTS 5,588,139 A * 12/1996 Lanier et al. ...................... 703/1
5,769,640 A * 6/1998 Jacobus et al. ............... 434/262
6,161,080 A * 12/2000 Aouni-Ateshian et al. ..... 703/11
(Continued)

FOREIGN PATENT DOCUMENTS

| JP | 3373296 B | 2/2003 |
| JP | 3517639 B | 4/2004 |

(Continued)

OTHER PUBLICATIONS

"Development of Integrated Design Support System on Virtual Reality Environment", The Institute of Electronics, Information and Communication Engineers, Technical Report of IEICE, May 1995, pp. 45-52.

(Continued)

*Primary Examiner* — Kee M Tung
*Assistant Examiner* — Haixa Du
(74) *Attorney, Agent, or Firm* — Carter, DeLuca, Farrell & Schmidt, LLP

(57) ABSTRACT

An image processing apparatus comprises a simulation unit which performs a simulation of operation of an object and a display unit which generates based on a result of the simulation an image in which a virtual object is operating and displays the image. The apparatus further comprises a calculating unit which calculates a position and orientation of a predetermined part of an observer who observes the virtual object being displayed, and a generating unit which generates a parameter for use in the simulation based on the position and orientation of the predetermined part of the observer and the position and orientation of the virtual object. This structure makes it possible to set parameters of simulation in a virtual-reality or mixed-reality space through manipulation performed by the observer.

13 Claims, 11 Drawing Sheets

(56) References Cited

U.S. PATENT DOCUMENTS

| | | | |
|---|---|---|---|
| 6,685,566 B2 | 2/2004 | Ohshima | |
| 7,257,521 B2 | 8/2007 | Hashima | |
| 7,830,334 B2 | 11/2010 | Takemoto | |
| 7,834,893 B2 | 11/2010 | Wanda et al. | |
| 7,839,417 B2* | 11/2010 | Ebensberger et al. | 345/592 |
| 8,022,967 B2 | 9/2011 | Okuno et al. | |
| 2003/0156144 A1* | 8/2003 | Morita | 345/848 |
| 2006/0161410 A1 | 7/2006 | Hamatani | |
| 2008/0059131 A1* | 3/2008 | Tokita et al. | 703/5 |
| 2009/0177452 A1* | 7/2009 | Ullrich et al. | 703/11 |

FOREIGN PATENT DOCUMENTS

| | | | |
|---|---|---|---|
| JP | 2005-049996 A | 2/2005 | |
| JP | 2005-107972 A | 4/2005 | |
| JP | 2005-346468 A | 12/2005 | |
| JP | 2006-048271 A | 2/2006 | |
| JP | 2006-126936 A | 5/2006 | |
| JP | 2006-195971 A | 7/2006 | |
| JP | 2006-277084 A | 10/2006 | |
| JP | 3897948 B | 3/2007 | |
| JP | 2008-040832 A | 2/2008 | |
| JP | 2009-087161 A | 4/2009 | |

OTHER PUBLICATIONS

Japanese Office Action issued in corresponding Japanese application No. 2009-149056 dated Jul. 23, 2013.

* cited by examiner

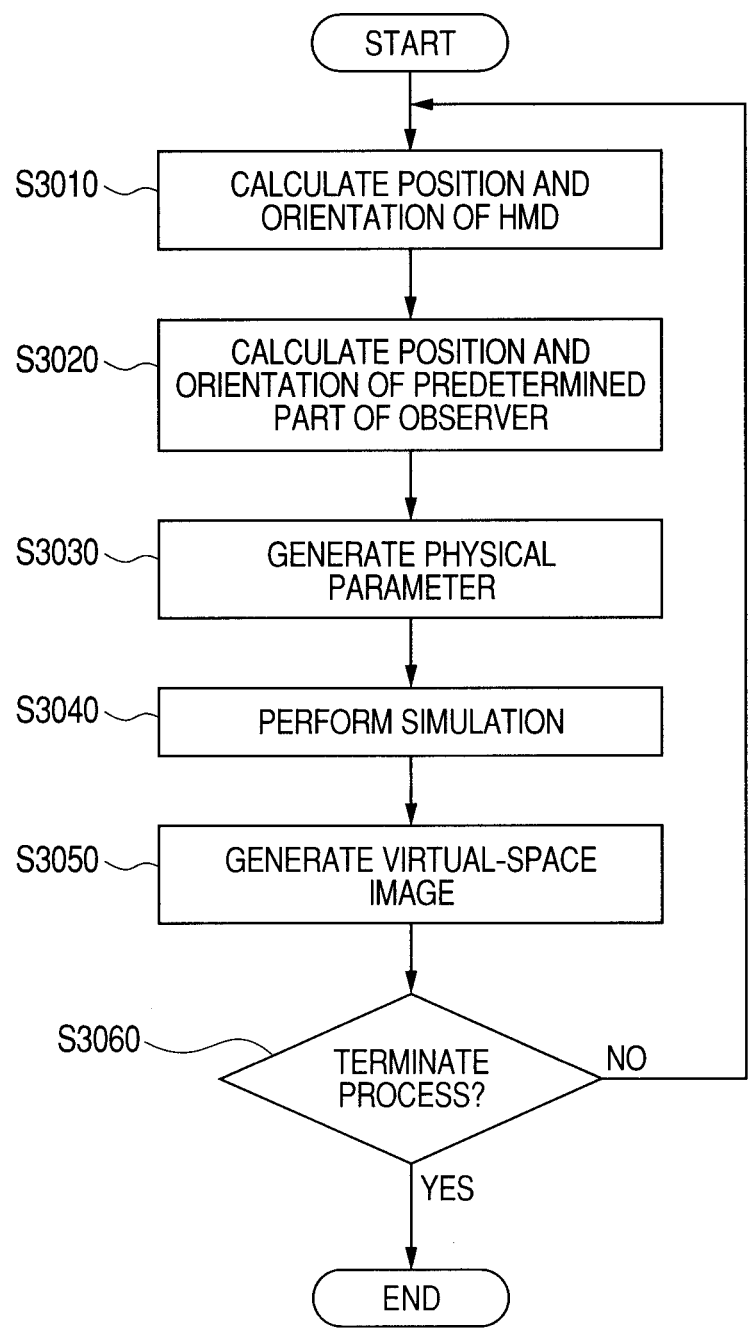

METHOD FOR SIMULATING OPERATION OF OBJECT AND APPARATUS FOR THE SAME

BACKGROUND OF THE INVENTION

1. Field of the Invention

The present invention relates to a method for simulating operation of an object and an apparatus therefor, and more particularly, to a method for manipulating a simulation during verification of simulation of design data in a virtual or real-world space and an apparatus therefor.

2. Description of the Related Art

In the field of machine design, three-dimensional CAD systems are employed that enable users to design a mechanism and its components with stereoscopic display of the mechanism and components. Systems of this type have an ability to simulate operation of components of a mechanism for aiding in development of a control program for controlling active components such as an actuator and a motor, or sensors, for example, without having to actually assemble the mechanism. A three-dimensional CAD system capable of such simulation is disclosed by Japanese Patent No. 03897948, for instance. Also, as disclosed in Japanese Patent Application Laid-Open No. 2006-195971, some three-dimensional CAD systems enable a user to design while performing an operational simulation using data designed with multiple CAD systems.

For a simulation to validate design data, various parameters are set. For example, as disclosed by Japanese Patent Application Laid-Open No. 2006-277084, there is a parameter setting method in which input parameters for multiple simulation modules are set on a GUI.

Meanwhile, studies on Mixed Reality (MR) which aims to seamlessly combine a real-world space with a virtual space have been actively conducted in recent years. An image display apparatus for presenting Mixed Reality has such a configuration as follows, for example. The apparatus displays an image which is formed by rendering an image of a virtual space (e.g., a virtual object drawn with computer graphics or text information) generated according to the position and orientation of an imaging apparatus, such as a video camera, over an image of a real-world space captured by the imaging apparatus. For such an apparatus, a head-mounted display (HMD) can be employed, for example.

Such an image display apparatus can also be realized by an optical see-through scheme, which displays an image of virtual space generated according to the viewpoint position and orientation of an observer on an optical see-through display worn by the observer on the head.

Such image display apparatuses have been applied to surgery assistance which displays an image showing the inside of a patient's body over his body surface, and Mixed Reality games in which players fight against virtual enemies floating in a real-world space. Further applications include navigation systems to display the name of or information on famous buildings or the like included in an image of a real-world space obtained by taking a picture of a town as a virtual-space image over the real-space image, landscape simulation to display a computer-graphics picture of a building that is scheduled to be constructed over an image obtained by taking a picture of the site where the building is going to be built, and design aiding systems that superimpose data designed with a 3D CAD system on a result of analysis (Computer Aided Engineering or CAE) conducted based on the design data, in a real-world space, for example. Such a design aiding system is disclosed by Japanese Patent Application Laid-Open No. 2006-048271, for instance. Hereinafter, a space in which Mixed Reality is presented using such an image display apparatus will be referred to as a Mixed-Reality space while a space to present virtual reality will be referred to as a virtual-reality space.

By the way, various types of user interface for manipulating virtual space have been proposed in relation to image display apparatuses to present a Mixed Reality or virtual-reality space to an observer. As disclosed by Japanese Patent No. 03373296, for instance, there is a user interface that generates information on an action a user intends to do from the result of measuring the head position and orientation of the user and the result of measuring the position and orientation of a certain body part of the user. Another type of user interface determines operation and internal state of a virtual object from the result of measuring the position and orientation of the user's certain body part, as disclosed by Japanese Patent No. 03517639, for example.

By combining these techniques, it is possible to make a model created with three-dimensional CAD or the like operate by simulation and superimpose the result of simulation as a virtual-space image on a real-world space to check the result of simulation.

In existing systems, however, setting such as addition and modification of parameters for use in simulation has to be made on a screen and simulation parameters cannot be set by an observer's motion or manipulation in a real-world space. Consequently, manipulation performed by the observer during observation of a simulation in a virtual-reality or Mixed-Reality space cannot be reflected in the result of simulation.

SUMMARY OF THE INVENTION

An object of the present invention is therefore to enable simulation parameters to be set through an observer's manipulation in a virtual-reality or Mixed-Reality space.

In order to solve the problems discussed above, the present invention provides an image processing apparatus which comprises: a simulation unit which performs a simulation of operation of an object; a display unit which generates based on a result of the simulation an image in which a virtual object is operating and displays the image; a calculating unit which calculates a position and orientation of a predetermined part of an observer who observes the virtual object being displayed; and a generating unit which generates a parameter for use in the simulation based on the position and orientation of the predetermined part of the observer and the position and orientation of the virtual object.

Further features of the present invention will become apparent from the following description of exemplary embodiments with reference to the attached drawings.

BRIEF DESCRIPTION OF THE DRAWINGS

FIG. 3 is a flowchart illustrating a processing procedure for the image processing apparatus according to the first embodiment.

DESCRIPTION OF THE EMBODIMENTS

Preferred embodiments of the present invention will now be described in detail in accordance with the accompanying drawings.

First Embodiment

Figure 1:
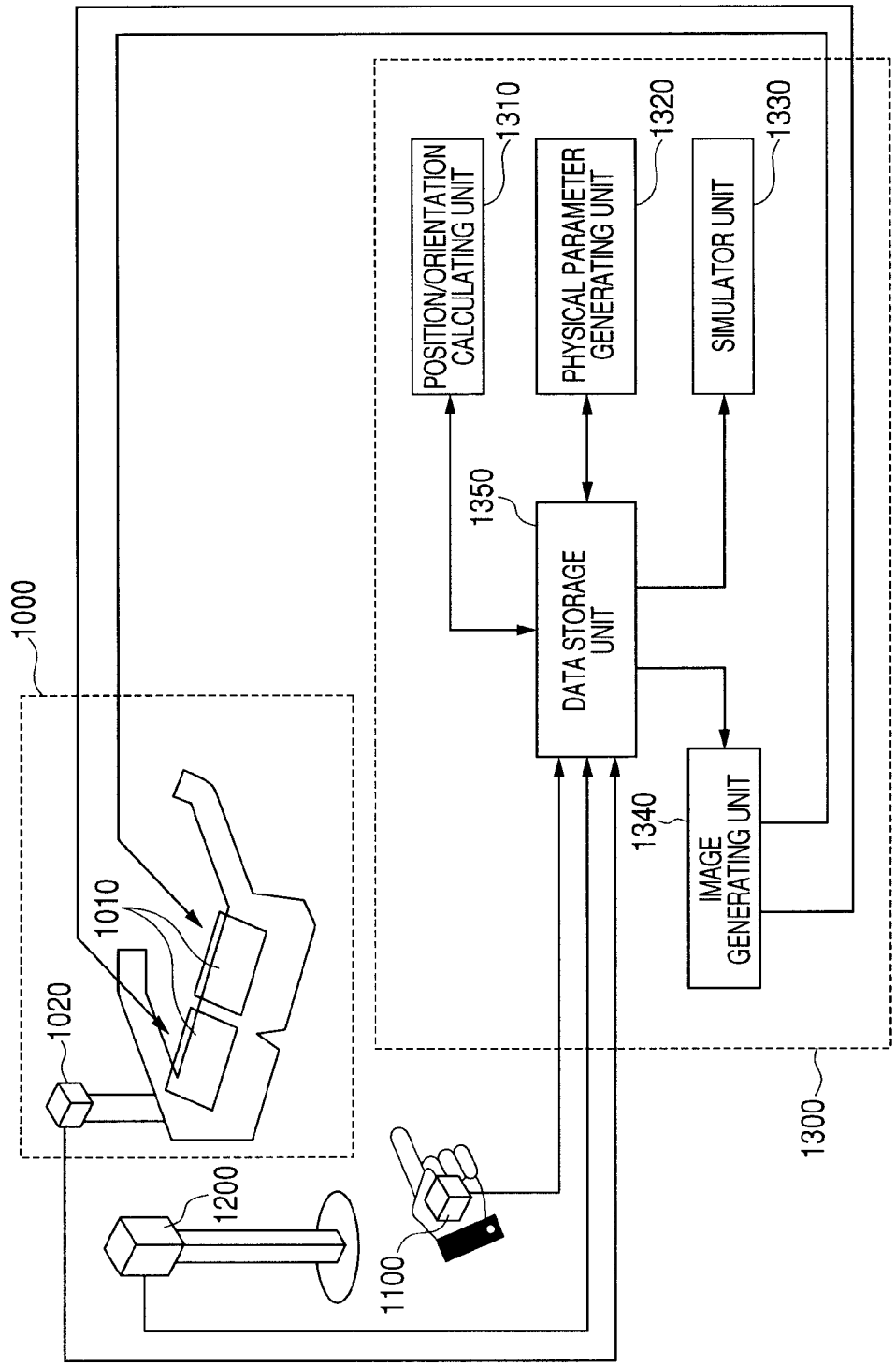
FIG. 1 is a block diagram illustrating an exemplary functional configuration of a system according to a first embodiment.

FIG. 1 is a block diagram showing an exemplary functional configuration of a system according to the first embodiment of the invention. As illustrated in FIG. 1, the system of the embodiment includes an image processing apparatus 1300, a magnetic transmitter 1200 for generating magnetism, a magnetic sensor 1100, and an HMD 1000 as an example of a head-mounted display device. The image processing apparatus 1300 and the HMD 1000 are connected with each other so that data can be communicated therebetween. Thus, connection between the image processing apparatus 1300 and the HMD 1000 may be either wired or wireless. Similarly, connection between the image processing apparatus 1300 and the magnetic transmitter 1200 as well as connection between the image processing apparatus 1300 and the magnetic sensor 1100 may be either wired or wireless.

HMD 1000 is described first. Display devices 1010, which may be liquid crystal screens or the like, display an image sent from the image processing apparatus. The display devices 1010, one for right eye and one for left eye, are attached to the HMD 1000 so as to be respectively positioned in front of the right eye and the left eye of an observer wearing the HMD 1000 on the head.

A magnetic sensor 1020 measures the position and orientation of the HMD 1000 by measuring a change in a magnetic field generated by the magnetic transmitter 1200, and inputs the result of measurement to the image processing apparatus 1300.

The magnetic sensor 1100 is attached on the observer's hand. Like the magnetic sensor 1020, the magnetic sensor 1100 measures a change in a magnetic field generated by the magnetic transmitter 1200 and inputs the result of measurement to the image processing apparatus 1300. Although the sensor 1100 is attached to a hand of the user who uses the system in the present embodiment, the sensor 1100 may be attached on the user's finger.

The image processing apparatus 1300 is described next. A position/orientation calculating unit 1310 uses results of measurement from the magnetic sensors 1020 and 1100 to calculate the position and orientation of the magnetic sensors and outputs the calculated positions and orientations to a data storage unit 1350. Thereby, the positions and orientations of the HMD 1000 and the observer's hand can be measured.

A physical parameter generating unit 1320 uses position and orientation information calculated by the position/orientation calculating unit 1310 to generate a physical parameter and outputs the physical parameter to the data storage unit 1350.

A simulator unit 1330 uses the physical parameter generated by the physical parameter generating unit 1320 and various parameters maintained in the data storage unit 1350 to carry out various types of simulation and stores the result of simulation in the data storage unit 1350.

An image generating unit 1340 constructs a virtual space based on data on virtual space stored in the data storage unit 1350. The virtual-space data includes results of simulation performed by the simulator unit 1330, data relating to virtual objects making up a virtual space, and data on a light source for illuminating the inside of a virtual space. The image generating unit 1340 then sets a viewpoint having a position and an orientation indicated by position and orientation information stored in the data storage unit 1350 in the virtual space. The image generating unit 1340 then generates an image of the virtual space that could be seen from the viewpoint (a virtual-space image). As techniques for generating a virtual-space image as seen from a viewpoint having a certain position and orientation are well-known, detailed descriptions thereof are omitted.

The data storage unit 1350 stores various types of information as mentioned above, being a RAM or a hard-disk drive device. It is assumed that known information in the present embodiment is stored in the data storage unit 1350 in addition to information described above as being stored in the data storage unit 1350.

FIG. 3 is a flowchart illustrating a process performed by the image processing apparatus 1300 for generating a virtual-space image and outputting the image to the HMD 1000.

First, at step S3010, the position/orientation calculating unit 1310 calculates the position and orientation of the HMD 1000.

At step S3020, the position/orientation calculating unit 1310 calculates the position/orientation of the observer's hand, which is a predetermined part of the observer.

At step S3030, the physical parameter generating unit 1320 generates a physical parameter for use by the simulator unit 1330 using the position/orientation information for the observer's hand, which is the predetermined part, calculated by the position/orientation calculating unit 1310 and position and orientation information for an object in virtual space.

Then, at step S3040, the simulator unit 1330 performs a simulation using the physical parameter generated by the physical parameter generating unit 1320.

At step S3050, the image generating unit 1340 generates an image of virtual space which could be seen from the position and orientation indicated by the position and orientation information calculated at step S3010.

Then, if an instruction to terminate this process is input or if a condition for terminating this process is satisfied, the process is terminated. However, if an instruction to terminate the process is not input nor the condition for terminating the process is satisfied, control is returned to step S3010 via step S3060.

Parameters generated by the physical parameter generating unit 1320 can be various parameters, an example of which will be shown below.

Figure 4A:
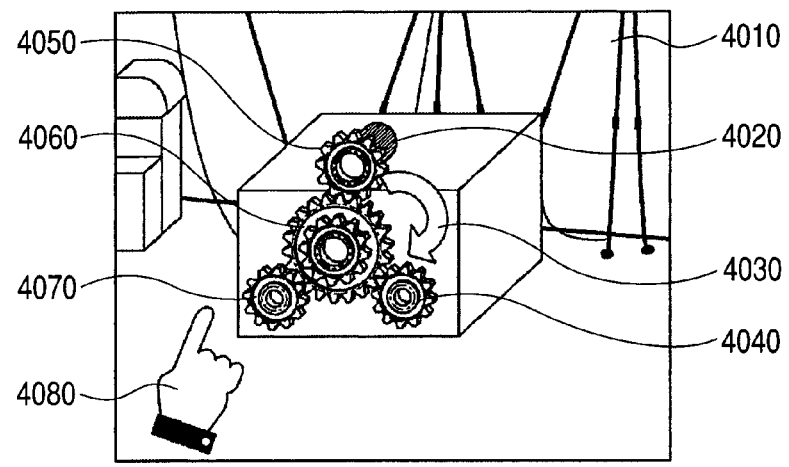
FIGS. 4A, 4B and 4C illustrate an example of simulation result display in the first embodiment.
Figure 4B:
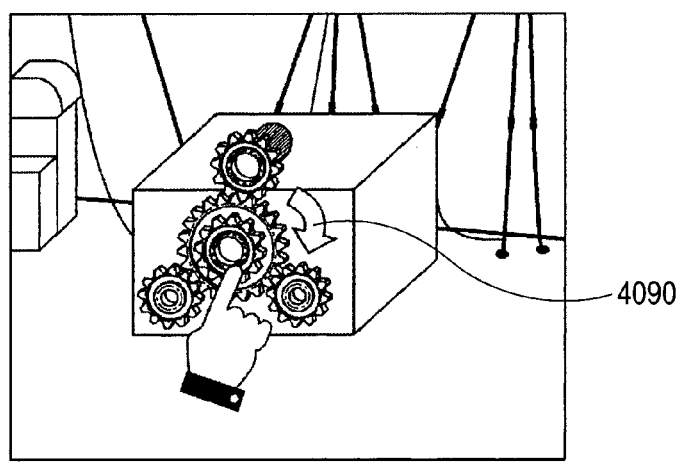
Figure 4C:
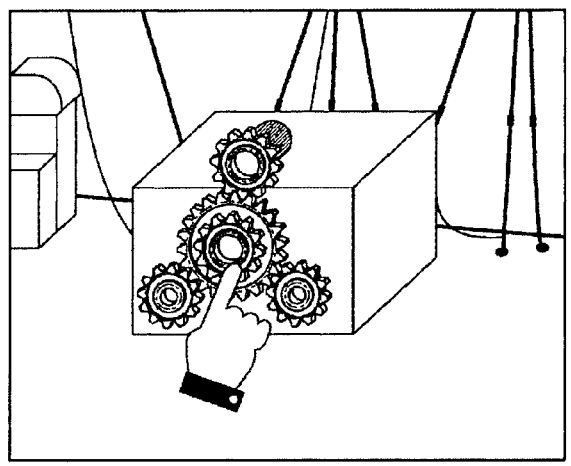

FIGS. 4A to 4C depict images indicating a result of simulation generated by the image generating unit 1340, showing that the result of simulation varies with a parameter generated by the physical parameter generating unit 1320.

An image 4010 represents a virtual space, drawn by the image generating unit 1340 by rendering a virtual space stored in the data storage unit 1350 as a picture as seen from the position and orientation of the HMD 1000. A motor 4020 is connected with a gear 4050. Gears 4040, 4050, 4060, and 4070 form a link mechanism with the motor 4020. Arrows 4030 and 4090 indicate the direction and speed of the gear 4060, which are additionally depicted for the purpose of describing the present embodiment and are not actually drawn. The arrows also indicate that the operation speed of the gear 4060 in FIG. 4A is higher than in FIG. 4B. A virtual image 4080 represents the observer's hand and is rendered with the position and orientation of the observer's hand calculated by the position/orientation calculating unit 1310.

In FIG. 4A, the motor is operating and the gears 4040, 4050, 4060 and 4070 are rotating according to a result of calculation by the simulator unit 1330. The gears are normally operating because the virtual image 4080 representing the observer's hand is not in contact with the gears in operation.

FIG. 4B shows the virtual image 4080 representing the observer's hand overlaps the gear 4060. In this situation, the physical parameter generating unit 1320 generates as a parameter a force in the perpendicular direction with respect to the rotation direction of the gear 4060 from the position and orientation of the virtual image 4080 representing the observer's hand and the position and orientation of the gear 4060. Using the force parameter generated, the simulator unit 1330 carries out a simulation. As a result, the rotation speed of the gear 4060 becomes slower than the speed in FIG. 4A, which is displayed on the HMD 1000.

In FIG. 4C, the virtual image 4080 representing the observer's hand overlaps the gear 4060 as in FIG. 4B but to a larger degree than in FIG. 4B. In this situation, the physical parameter generating unit 1320 generates a force in perpendicular direction with respect to the rotation direction of the gear 4060 as a parameter representing a force larger than in the case of FIG. 4B, from the position and orientation of the virtual image 4080 representing the observer's hand and the position and orientation of the gear 4060. Using the force parameter generated, the simulator unit 1330 carries out a simulation. As a result, the gear 4060 with its operation stopped is displayed on the HMD 1000.

The above-described embodiment gives an additional physical parameter to an operating virtual object as a result of simulation; however, a physical parameter itself for a virtual object may be manipulated. An example is shown below.

Figure 5A:
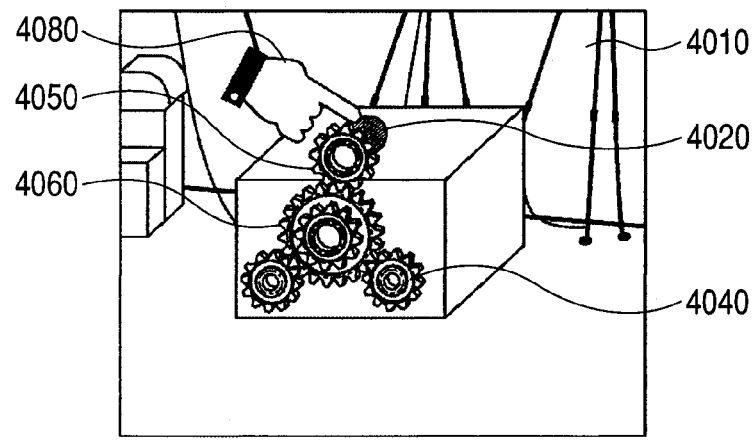
FIGS. 5A, 5B and 5C illustrate another example of simulation result display in the first embodiment.
Figure 5B:
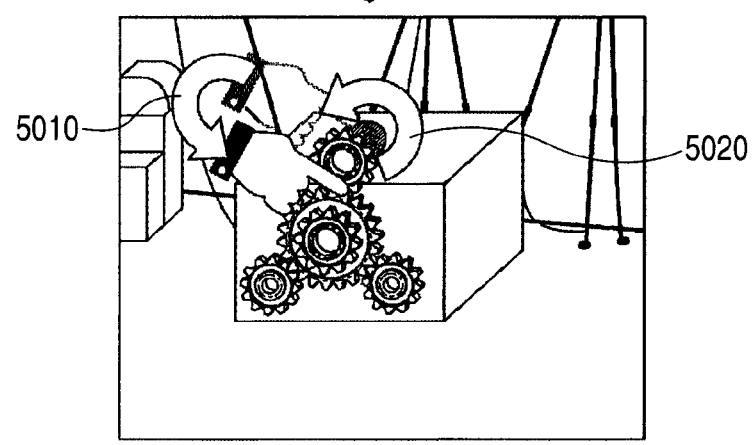
Figure 5C:
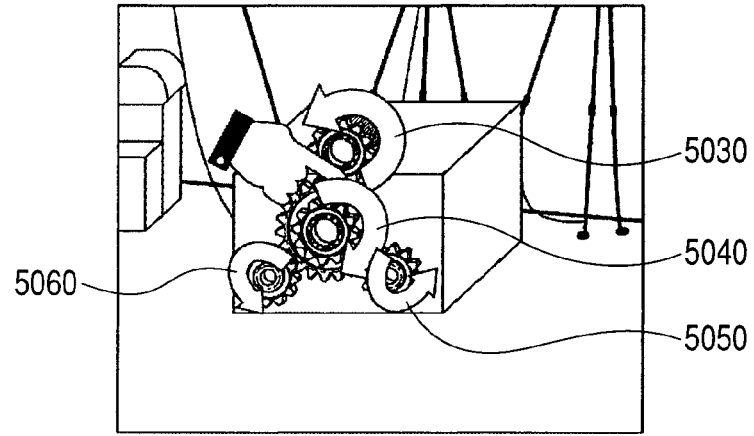

FIGS. 5A to 5C illustrate images indicating a result of simulation generated by the image generating unit 1340, showing that the result of simulation varies with a parameter generated by the physical parameter generating unit 1320. The same elements as those in FIG. 4A to 4C are given the same reference numerals and descriptions of such elements are omitted.

FIG. 5A shows that the motor is at rest and the virtual image 4080 representing the observer's hand overlaps the motor 4020.

FIG. 5B shows that the virtual image 4080 representing the observer's hand has moved from the position of FIG. 5A as indicated by an arrow 5010. Here, the physical parameter generating unit 1320 generates a rotation parameter in the direction of an arrow 5020 from the position and orientation of the virtual image 4080 representing the observer's hand and the position and orientation of the motor 4020. Using the rotation parameter, the simulator unit 1330 carries out a simulation. As a result, the gears 4040, 4050, 4060 and 4070 operating as indicated by arrows 5030, 5040, 5050 and 5060 in FIG. 5C are displayed on the HMD 1000.

Figure 6:
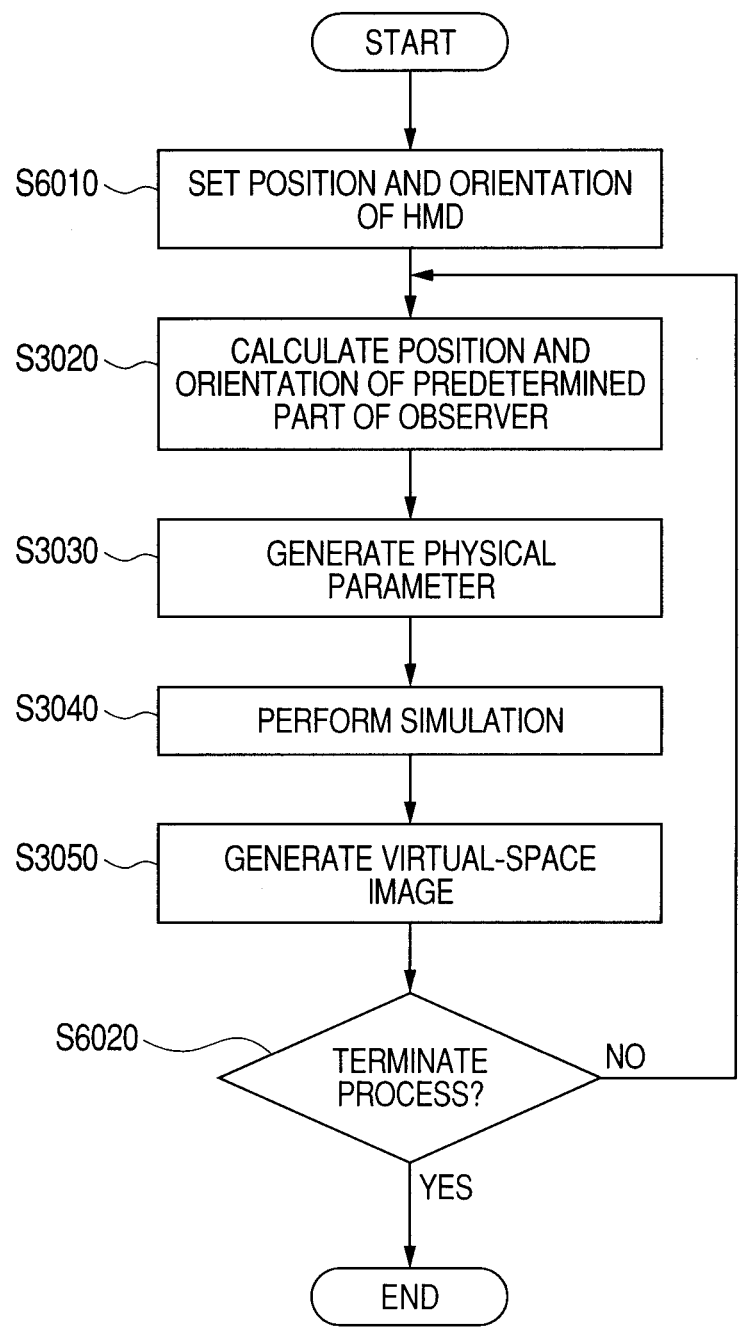
FIG. 6 is a flowchart illustrating another processing procedure for the image processing apparatus according to the first embodiment.

Although the above-described embodiment measures the head position and orientation every time, the head position and orientation does not have to be measured every time when the HMD 1000 is fixed, for example. A flowchart corresponding to this case is shown in FIG. 6. The same steps as those of FIG. 3 are given the same numbers and descriptions of such steps are omitted.

First, at step S6010, the position and orientation of the HMD 1000 is set. The position and orientation of the HMD 1000 may be set by calculation at the position/orientation calculating unit 1310, or previously calculated values of position and orientation may be retrieved from the data storage unit 1350.

At step S6020 following step S3050, the process is terminated if an instruction to terminate the process is input or if a condition for terminating the process is satisfied. On the other hand, if an instruction to terminate the process is not input nor the condition for terminating the process is satisfied, control is returned to step S3020 via step S6020.

The above-described embodiment uses simulation of operation as an example of simulation, but this is not limitative. That is to say, the image processing apparatus of the invention may perform any type of simulation so long as physical parameters for simulation can be generated from position and orientation information for a certain part of the observer and simulation can be performed using the physical parameters.

Although the above-described embodiment generates a physical parameter based on the position and orientation of a virtual object and the position and orientation of the observer's hand, the predetermined part of the observer in the present invention is not limited to a hand. That is to say, the predetermined part may be a body part such as a finger tip, arm, elbow, foot, thigh, and leg, instead of a hand, so long as the part is used for the purpose of generating a physical parameter and reflecting the parameter in simulation.

In addition, although a single part of the observer is used in the above embodiment, this is not limitative. That is to say, the observer's head and hand, both hands, or both feet may be used as predetermined parts, for example. Further, the predetermined part may be a body part estimated using a motion capture technique, for example.

In addition, the predetermined part of the observer is not limited to a human body part. That is to say, the predetermined part of the observer may be a part at which an article such as a metallurgic tool, accessory, and foot wear can be attached to or fixed on a human body.

Further, although the above-described embodiment measures the position and orientation of the observer's hand by attaching a position and orientation sensor on the observer's hand, the present invention is not limited to attaching a position and orientation sensor on a certain part of the observer at all times. That is to say, a physical parameter may be generated also when the position and orientation sensor is detached from the certain part of the observer or when the position and orientation sensor is detached from the certain part of the observer and then attached to some object.

Although the above-described embodiment generates a single physical parameter for use in simulation based on the position and orientation of a virtual object and the position and orientation of the observer's hand, more than one parameter may be generated. For example, in FIG. 4, in addition to the force parameter, material information for the observer's hand and/or a friction coefficient between the observer's hand and a gear may be generated. Also, a parameter that is temporally continuous and variable may be generated.

Although the above-described embodiment shows the HMD as an apparatus for presenting a virtual space to the observer, the HMD may be an HMD of optical see-through type that enables the observer to see through the real space.

Second Embodiment

Figure 7:
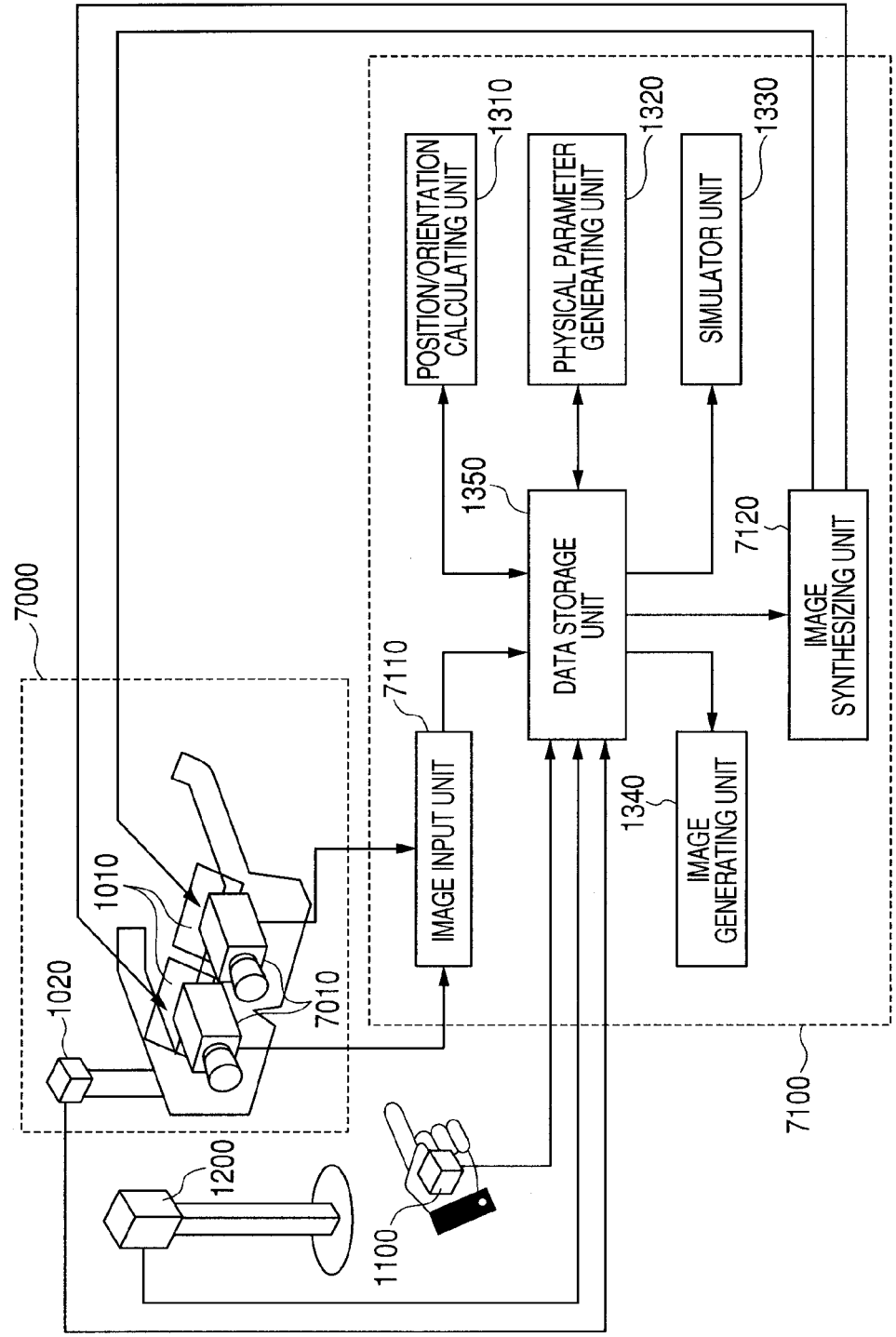
FIG. 7 is a block diagram illustrating an exemplary functional configuration of a system according to a second embodiment.

The HMD may also be an HMD of video see-through type that takes a picture of a real-world space and synthesize the image with an image of a virtual space. FIG. 7 illustrates a case where an HMD 7000 of video see-through type is utilized. The same components as those in FIG. 1 are denoted with the same reference numerals and descriptions of such components are omitted.

Imaging apparatuses 7010, which may be a video camera, for example, take a moving image of a real-world space. The imaging apparatuses 7010 then send images of frames constituting the moving image (real-space images) to an image processing apparatuses 7100 sequentially. The imaging apparatuses 7010, one for right eye and one for left eye, respectively take a moving image of a real-world space as seen from the right eye of the observer wearing the HMD 7000 on the head and a moving image of the real-world space as seen from his/her left eye.

An image input unit 7110 obtains the real-space images for the right and left eyes sent from the imaging apparatus 7010, and stores the real-space images in the data storage unit 1350.

An image synthesizing unit 7120 first draws a real-space image stored in the data storage unit 1350 in memory managed by the image synthesizing unit 7120. The image synthesizing unit 7120 then draws a virtual-space image generated by an image generating unit 1340 over the real-space image to generate a synthesized image of the real-space image and the virtual-space image in the memory. The synthesized image is output to the display devices 1010 of the HMD 7000.

Figure 8:
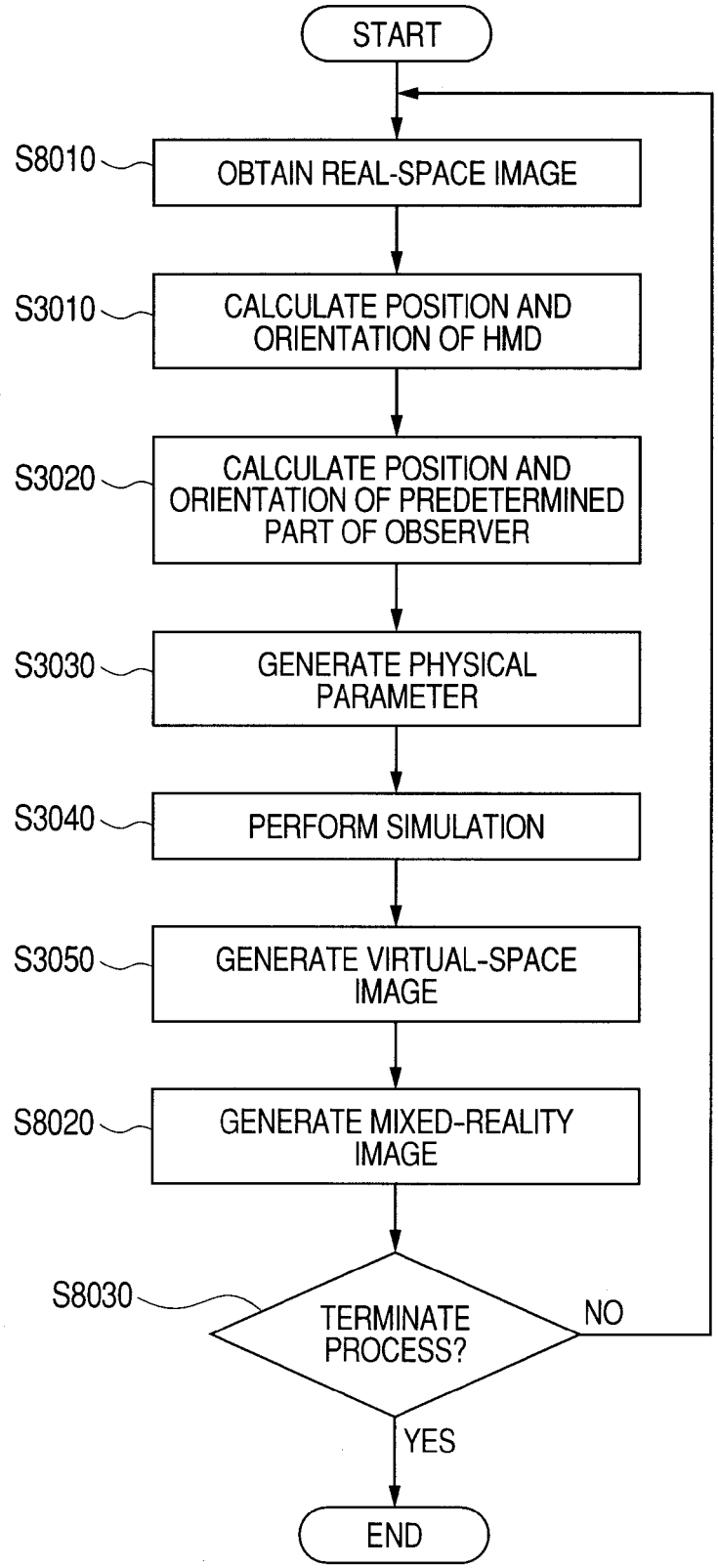
FIG. 8 is a flowchart illustrating a processing procedure for the image processing apparatus according to the second embodiment.

FIG. 8 is a flowchart illustrating a process for the image processing apparatus 7100 to generate a mixed-reality space image and output the image to the HMD 7000. The same steps as those in FIG. 3 are given the same numbers and descriptions of such steps are omitted.

First, at step S8010, the image input unit 7110 obtains or captures a real-space image (a result of imaging) sent from the imaging apparatus 7010.

Then, at step S8020, the image synthesizing unit 7120 draws the real-space image obtained at step S8010 in memory managed by the image synthesizing unit 7120. The image synthesizing unit 7120 then draws a virtual-space image generated by the image generating unit 1340 over the real-space image drawn in the memory to generate a synthesized image of the real-space image and the virtual-space image in the memory. The synthesized image is then output to the display devices 1010 of the HMD 7000.

Third Embodiment

Figure 9:
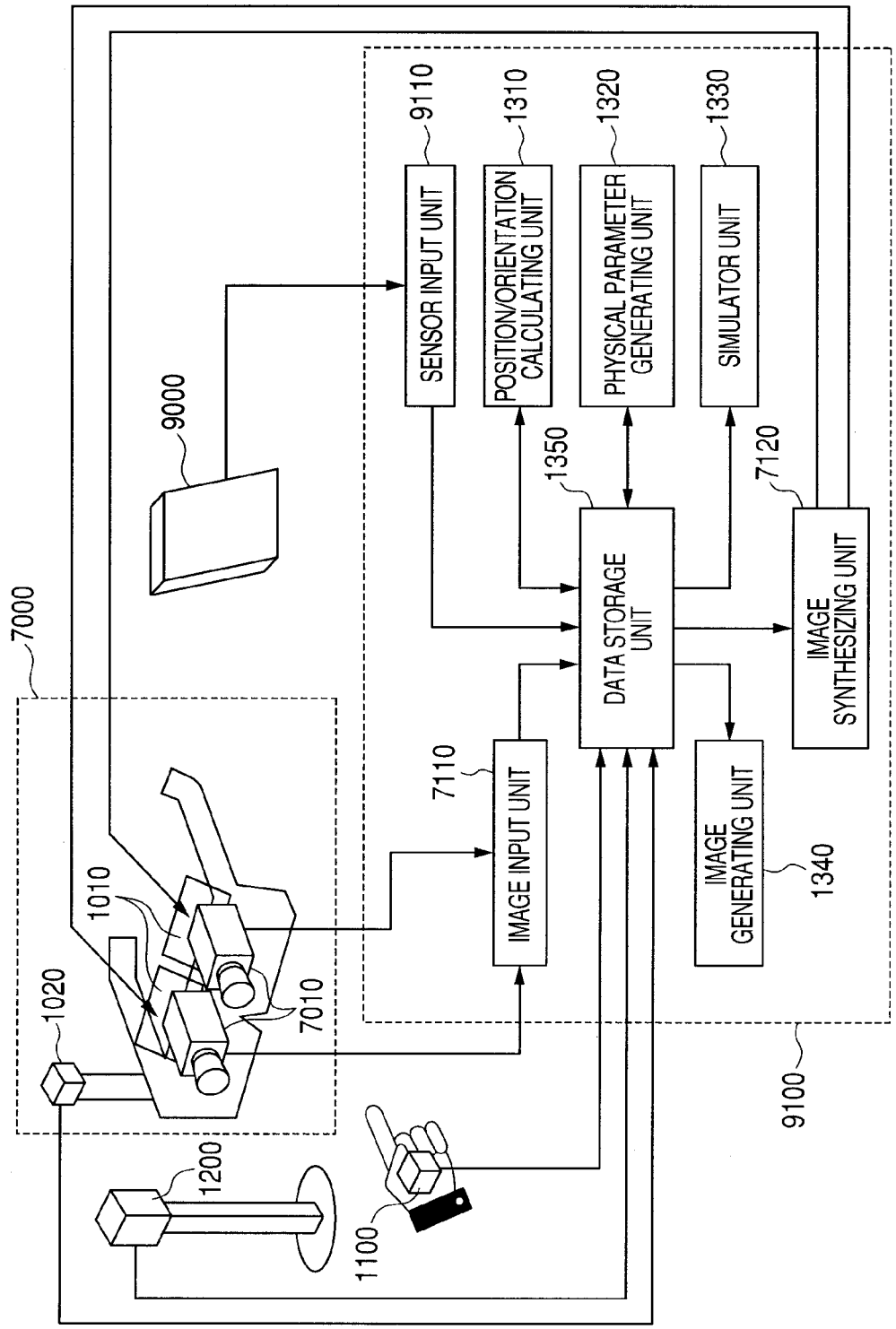
FIG. 9 is a block diagram illustrating an exemplary functional configuration of a system according to a third embodiment.

Although the above-described embodiments generate a physical parameter for use in simulation based on the position and orientation of a virtual object and the position and orientation of the observer's hand, the physical parameter may be generated also using information from a pressure-sensitive sensor in addition to the position and orientation information. FIG. 9 illustrates a case where a pressure-sensitive sensor 9000 is utilized in an image processing apparatus 9100. The same components as those in FIG. 7 are denoted with the same reference numerals and descriptions of such components are omitted.

The pressure-sensitive sensor 9000 measures pressure information and outputs the result of measurement to the image processing apparatus 9100. The pressure-sensitive sensor 9000 is equipped with a magnetic sensor, which measures the position and orientation of the pressure-sensitive sensor 9000.

A sensor input unit 9110 of the image processing apparatus 9100 obtains the pressure information measured by the pressure-sensitive sensor 9000. The pressure information obtained is stored in the data storage unit 1350.

Figure 10:
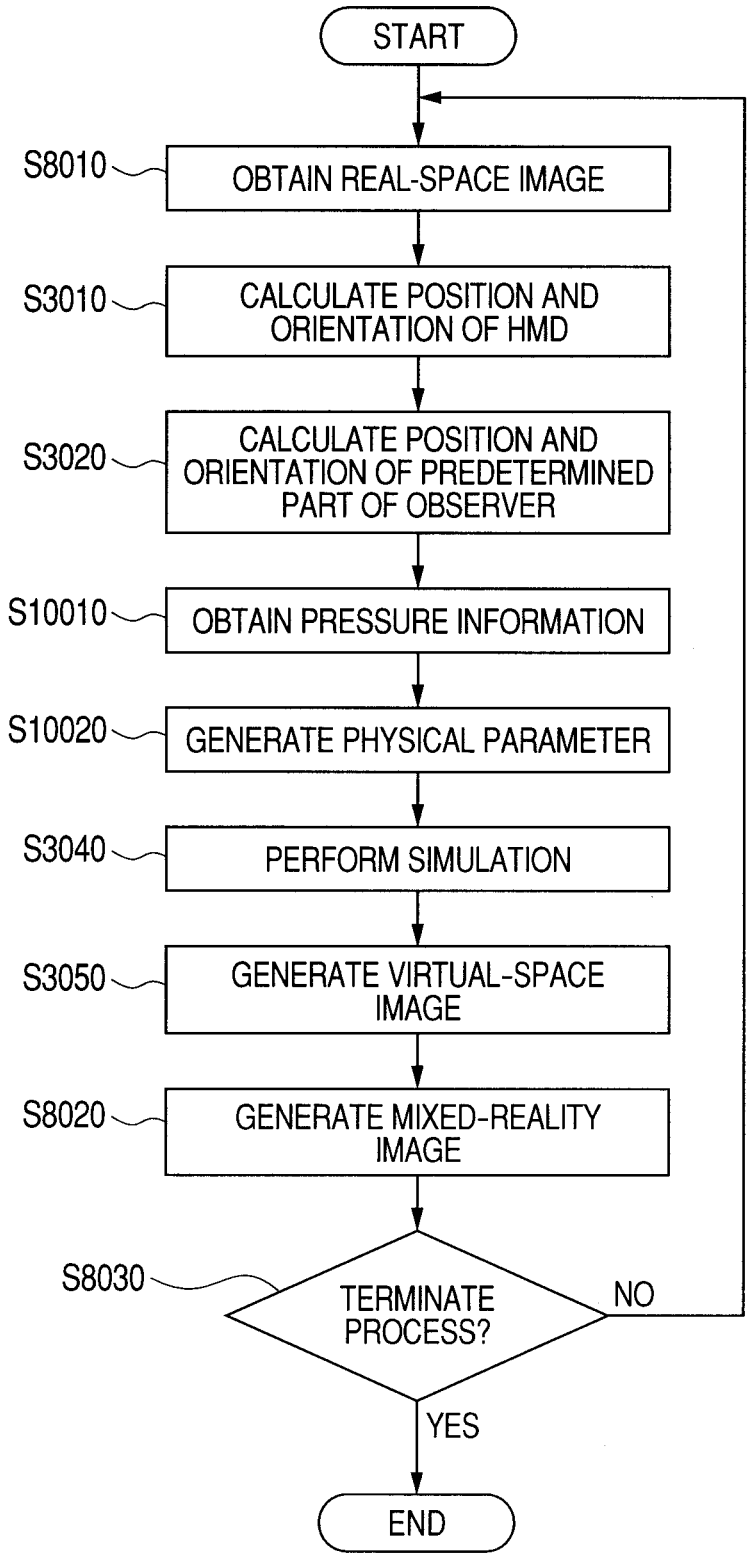
FIG. 10 is a flowchart illustrating a processing procedure for the image processing apparatus according to the third embodiment.

FIG. 10 is a flowchart of a process for the image processing apparatus 9100 to generate a virtual-reality-space image and outputs the image to the HMD 7000. The same steps as those in FIG. 8 are given the same numbers and descriptions of such steps are omitted.

At step S10010, the sensor input unit 9110 obtains pressure information sent from the pressure-sensitive sensor 9000.

At step S10020, the physical parameter generating unit 1320 generates a physical parameter using the position and orientation of the observer's hand, the position and orientation of a virtual object, the position and orientation of the pressure-sensitive sensor 9000, and the pressure information obtained at step S10010.

Figure 11A:
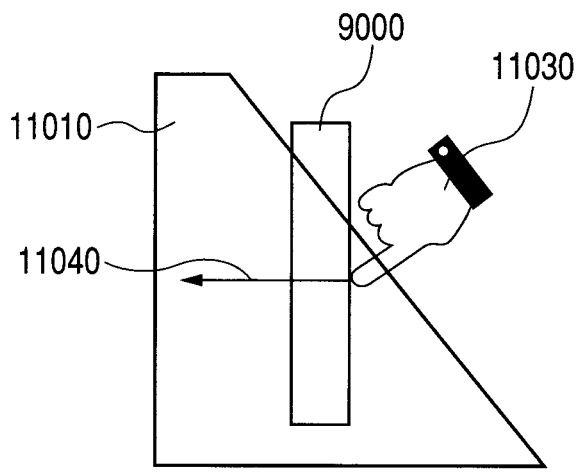
FIGS. 11A, 11B and 11C illustrate generation of a physical parameter in the third embodiment.
Figure 11B:
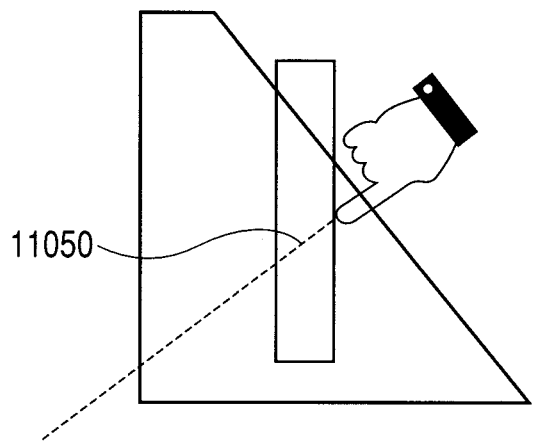
Figure 11C:
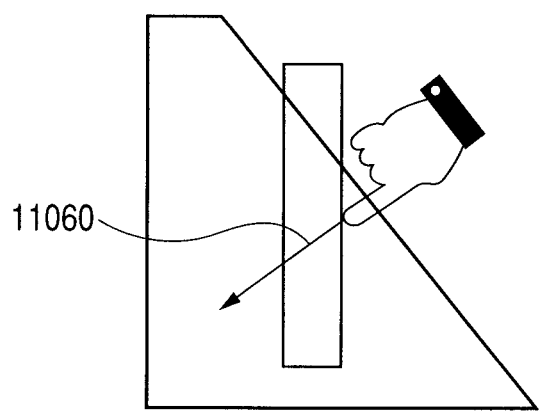

FIGS. 11A to 11C illustrate generation of a physical parameter by the physical parameter generating unit 1320 using the pressure-sensitive sensor 9000. A virtual object 11010 is a virtual object that is used in simulation. A hand 11030 represents the observer's hand, which is the predetermined part of the observer.

When the hand 11030, the observer's predetermined part, presses the pressure-sensitive sensor 9000, the pressure-sensitive sensor 9000 measures a pressure as indicated by an arrow 11040. Then, from the position and orientation of the hand 11030 and the position and orientation of the virtual object, the position and orientation of a force parameter to be input to the virtual object 11010 is determined. Next, a force parameter 11050 is generated by setting the pressure measured by the pressure-sensitive sensor 9000 as the magnitude of the force parameter. The arrow and the line 11040 and 11050 are additionally depicted for the purpose of describing the embodiment and do not have to be drawn in an actual Mixed-Reality space image.

Although the third embodiment utilizes a pressure-sensitive sensor, the position and orientation of the pressure-sensitive sensor may be further measured and the position and orientation information for the pressure-sensitive sensor may be used to generate a physical parameter.

Although the physical parameter generating unit 1320 generates a parameter by a predetermined method in the above-described embodiments, the method for parameter generation is not limited thereto. An operator may modify a configuration file relating to generation of a physical parameter through interactive manipulation, or a GUI for specifying how to generate a physical parameter may be provided to determine the method of generating a physical parameter.

Although the above-described embodiments use a magnetic sensor as a sensor for measuring position and orientation, position and orientation may be measured by image processing. Also, position and orientation may be measured by using infrared light, ultrasound, or mechanically.

Although one observer is involved in the above-described embodiments, the present invention may be practiced with more then one observer.

In the embodiments described above, all components constituting the image processing apparatuses 1300, 7100 and 9100 shown in FIGS. 1, 7 and 9 are described as implemented in hardware. However, some of the components may be implemented in software. In this case, by causing the software to be executed by a computer implementing the remaining portion in hardware, the computer performs the operations of the image processing apparatus 1300 described in the embodiment above.

Figure 2:
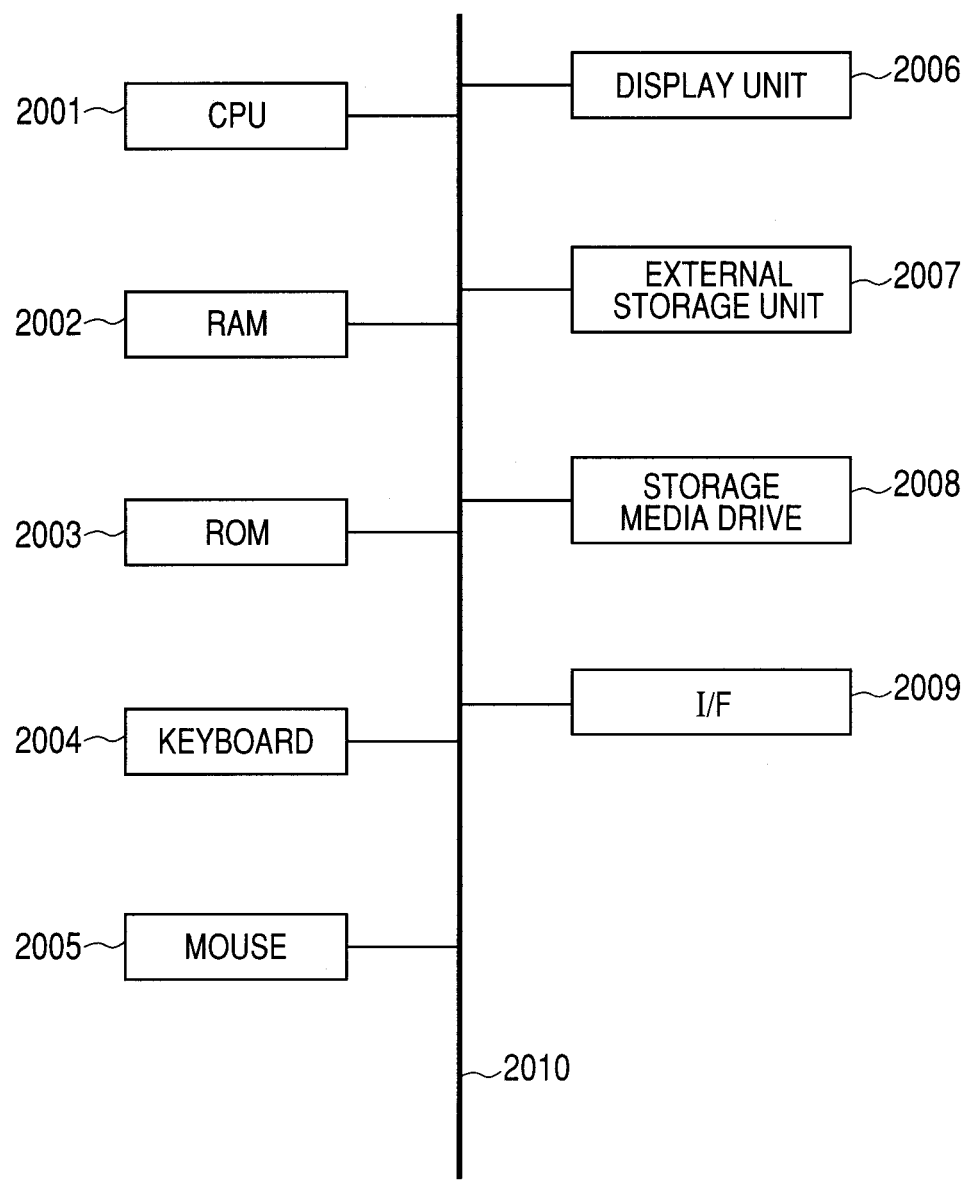
FIG. 2 is a block diagram illustrating an exemplary hardware configuration of a computer applicable to an image processing apparatus.

FIG. 2 is a block diagram illustrating an exemplary hardware configuration of a computer that is applicable to the image processing apparatuses 1300, 7100 and 9100.

A CPU 2001 controls the entire computer using programs and data stored in a RAM 2002 and a ROM 2003, and also executes the processes described as performed by the image processing apparatuses 1300, 7100 and 9100 in the above embodiments.

The RAM 2002 has an area for temporarily storing a program or data loaded from an external storage device 2007 and a storage media drive 2008. The RAM 2002 further has an area for temporarily storing data received from external sources via an I/F (interface) 2009 (in FIG. 1, the result of magnetic measurement). The external sources refer to the magnetic sensors 1020, 1100, the imaging apparatus 7010, and the pressure-sensitive sensor 9000. The data received from external sources refers to, in the case of FIG. 1, the result of magnetic measurement and a real-space image. The RAM 2002 further has a work area for use when the CPU 2001 performs processing. That is to say, the RAM 2002 can provide various sorts of areas as required. The RAM 2002 also functions as the data storage unit 1350 shown in FIG. 1.

In the ROM 2003, configuration data for the computer, a boot program, and the like are stored.

A keyboard 2004 and a mouse 2005 are examples of operation input devices, which can be operated by the user of the computer to input various instructions to the CPU 2001.

A display unit 2006 includes a CRT, a liquid crystal screen or the like and can display a result of processing by the CPU 2001 as an image or text. For example, a message that should be indicated for measuring the position and orientation of the HMD 1000 can be displayed on the display unit 2006.

The external storage device 2007 is a bulk information storage device represented by a hard-disk drive device. The external storage device 2007 stores an Operating System (OS), and programs and data for causing the CPU 2001 to execute the processes described above as performed by the image processing apparatus 1300. The programs include programs corresponding to the position/orientation calculating unit 1310, physical parameter generating unit 1320, simulator unit 1330, image generating unit 1340, image input unit 7110, image synthesizing unit 7120, and sensor input unit 9110. The data includes data on virtual space and data described above as known information. A program and data stored in the external storage device 2007 are loaded to the RAM 2002 as required according to control by the CPU 2001. The CPU 2001 uses the loaded program or data to execute processing to carry out the processes described above as performed by the image processing apparatuses 1300, 7100 and 9100. The external storage device 2007 may be used as the data storage unit 1350 shown in FIGS. 1, 7 and 9.

The storage media drive 2008 reads a program and/or data recorded in a storage medium, such as a CD-ROM and DVD-ROM, and writes a program and/or data to the storage medium. Some or all of the programs or data described above as being stored in the external storage device 2007 may be recorded in the storage medium. A program or data read from the storage medium by the storage media drive 2008 is output to the external storage device 2007 and/or the RAM 2002.

The I/F 2009 includes an analog video port or a digital input/output port such as IEEE1394 for connecting the imaging apparatus 7010, or an Ethernet (a registered trademark) port for outputting a synthesized image to the display devices 1010 of the HMD 1000. Data received via the I/F 2009 is input to the RAM 2002 and/or the external storage device 2007. Some of functions of the image input unit 7010 shown in FIG. 7 are realized by the I/F 2009. When a sensor system is used for obtaining position/orientation information, the sensor system is connected to the I/F 2009.

A bus 2010 connects the components.

Various exemplary embodiments, features, and aspects of the present invention will now be herein described in detail below with reference to the drawings. It is to be noted that the relative arrangement of the components, the numerical expressions, and numerical values set forth in these embodiments are not intended to limit the scope of the present invention.

Aspects of the present invention can also be realized by a computer of a system or apparatus (or devices such as a CPU or MPU) that reads out and executes a program recorded on a memory device to perform the functions of the above-described embodiments, and by a method, the steps of which are performed by a computer of a system or apparatus by, for example, reading out and executing a program recorded on a memory device to perform the functions of the above-described embodiments. For this purpose, the program is provided to the computer for example via a network or from a recording medium of various types serving as the memory device (e.g., computer-readable medium).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-149056, filed Jun. 23, 2009, which is hereby incorporated by reference herein in its entirety.

What is claimed is:

1. An image processing apparatus which performs a simulation of an operation of an object, the apparatus comprising:
at least one processor configured to:
obtain a real space image including a predetermined part of an observer who observes a result of the simulation, the real space image being captured by an image capturing unit attached on a display device;
acquire a position of a predetermined part of the observer based on the obtained real space image;
obtain a degree of overlapping between the predetermined part of the observer and a virtual object representing the object based on the position of the predetermined part of the observer and the position of the virtual object;
determine a parameter for use in the simulation based on the obtained degree of overlapping;
perform the simulation of the operation of the object by using the determined parameter;
generate, by synthesizing the real space image and a result of the simulation, an image in which the virtual object is operating; and
output the generated image to the display device.

2. The image processing apparatus according to claim 1, wherein the at least one processor is further configured to acquire the position of the observer's head, and control a value of the parameter for use in the simulation based on the position of the observer's head, the position of the predetermined part of the observer, and the position of the virtual object.

3. The image processing apparatus according to claim 1, wherein the display device displays an image so that the image can be seen through a real-world space.

4. The image processing apparatus according to claim 1, wherein the at least one processor is further configured to take a picture of a real-world space and generate an image in which the virtual object is displayed over the picture of the real-world space.

5. The image processing apparatus according to claim 1, wherein the predetermined part is a hand.

6. The image processing apparatus according to claim 1, wherein the predetermined part is a part of the observer at which an article is held or attached.

7. The image processing apparatus according to claim 1, wherein the at least one processor is configured to acquire positions of a plurality of predetermined parts, utilize the positions of the plurality of predetermined parts, and generate a plurality of physical parameters.

8. The image processing apparatus according to claim 1, wherein the at least one processor is configured to acquire the position of a predetermined part of a plurality of observers, and utilize the position of a predetermined part of a plurality of observers.

9. The image processing apparatus according to claim 1, further comprising a pressure-sensitive sensor to obtain pressure information,
wherein the at least one processor is configured to utilize the pressure information.

10. The image processing apparatus according to claim 9, wherein the at least one processor is further configured to measure the position of the pressure-sensitive sensor, and utilize the position of the pressure-sensitive sensor.

11. The image processing apparatus according to claim 1, wherein the display device is a head-mounted display which the observer mounts.

12. An image processing method for performing a simulation of an operation of an object, the method comprising:
obtaining a real space image including a predetermined part of an observer who observes a result of the simulation, the real space image being captured on a display device;
acquiring a position of a predetermined part of the observer based on the obtained real space image;
obtaining a degree of overlapping between the predetermined part of the observer and a virtual object representing the object based on the position of the predetermined part of the observer and the position of the virtual object;
determining a parameter for use in the simulation based on the obtained degree of overlapping;
performing the simulation of the operation of the object by using the determined parameter;
generating, by synthesizing the real space image and a result of the simulation, an image in which the virtual object is operating; and
outputting the generated image to the display device.

13. A non-transitory computer-readable storage medium for storing a program which causes a computer to execute an image processing method for performing a simulation of an operation of an object, the method comprising:
obtaining a real space image including a predetermined part of an observer who observes a result of the simulation, the real space image being captured on a display device;
acquiring a position of a predetermined part of the observer based on the obtained real space image;
obtaining a degree of overlapping between the predetermined part of the observer and a virtual object representing the object based on the position of the predetermined part of the observer and the position of the virtual object;
determining a parameter for use in the simulation based on the obtained degree of overlapping;
performing the simulation of the operation of the object by using the determined parameter;
generating, by synthesizing the real space image and a result of the simulation, an image in which the virtual object is operating; and
outputting the generated image to the display device.

* * * * *